(12) United States Patent
Yin et al.

(10) Patent No.: US 11,644,547 B2
(45) Date of Patent: May 9, 2023

(54) TIME-OF-LIGHT SENSING DEVICE AND METHOD THEREOF

(71) Applicant: Taiwan Semiconductor Manufacturing Co., Ltd., Hsinchu (TW)

(72) Inventors: Chin Yin, Tainan (TW); Shang-Fu Yeh, Hsinchu (TW); Calvin Yi-Ping Chao, Hsinchu County (TW); Chih-Lin Lee, Miaoli County (TW); Meng-Hsiu Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 789 days.

(21) Appl. No.: 16/454,091

(22) Filed: Jun. 27, 2019

(65) Prior Publication Data

US 2020/0408885 A1 Dec. 31, 2020

(51) Int. Cl.
*G01S 7/48* (2006.01)
*G01S 7/4861* (2020.01)
(Continued)

(52) U.S. Cl.
CPC .......... *G01S 7/4861* (2013.01); *G01S 7/4865* (2013.01); *G01S 17/10* (2013.01); *G04F 10/005* (2013.01); *H03L 7/0812* (2013.01); *H03L 7/0891* (2013.01)

(58) Field of Classification Search
USPC ....................................................... 356/5.01
See application file for complete search history.

(56) References Cited

U.S. PATENT DOCUMENTS 11,199,444 B2 * 12/2021 Yin ........................ H03L 7/0812
2007/0182949 A1 * 8/2007 Niclass .................... G01S 7/491
356/3

(Continued)

OTHER PUBLICATIONS

Cristiano Niclass, et al., "A 128×128 Single-Photon Image Sensor With Column-Level 10-Bit Time-to-Digital Converter Array," IEEE, vol. 43, Issue 12, Dec. 12, 2008, pp. 2977-2989.

(Continued)

*Primary Examiner* — James R Hulka
(74) *Attorney, Agent, or Firm* — JCIPRNET

(57) ABSTRACT

A sensing device that is configured to determine a depth result based on time-of-flight value is introduced. The sensing device includes a delay locked loop circuit, a plurality of time-to-digital converters, a multiplexer and a digital integrator. The delay locked loop circuit is configured to output a plurality of delay clock signals through output terminals of the delay locked loop circuit. The plurality of time-to-digital converters include a plurality of latches. The multiplexer is configured to select a sub-group of m latches among the latches of the plurality of time-to-digital converters to be connected to the output terminals of the delay locked loop circuit according to a control signal. The digital integrator is coupled to the plurality of time-to-digital converters and is configured to integrate digital outputs generated by the time-to-digital converters in each of n cycles to generate n raw data frames, wherein m and n are natural numbers, and the n raw data frames are used to generate the depth result.

10 Claims, 14 Drawing Sheets

(51) Int. Cl.
*G01S 7/4865* (2020.01)
*G01S 17/10* (2020.01)
H03L 7/089 (2006.01)
H03L 7/081 (2006.01)
G04F 10/00 (2006.01)

(56) References Cited

U.S. PATENT DOCUMENTS

| | | | | |
|---|---|---|---|---|
| 2013/0300838 | A1* | 11/2013 | Borowski | H04N 5/335 |
| | | | | 348/46 |
| 2015/0041625 | A1* | 2/2015 | Dutton | G01T 1/2985 |
| | | | | 341/166 |
| 2015/0172570 | A1* | 6/2015 | Goto | H04N 5/3559 |
| | | | | 250/208.1 |
| 2016/0150963 | A1* | 6/2016 | Roukes | A61B 5/4029 |
| | | | | 600/476 |
| 2019/0165792 | A1* | 5/2019 | Huh | H03L 7/0802 |
| 2019/0257950 | A1* | 8/2019 | Patanwala | G01S 17/14 |
| 2019/0259902 | A1* | 8/2019 | Shimizu | H01L 27/1446 |
| 2020/0018642 | A1* | 1/2020 | Yin | G01S 7/4865 |

OTHER PUBLICATIONS

S. Tisa, et al., "Fully-integrated CMOS single photon counter," Optics Express, vol. 15, No. 6, Mar. 19, 2007, pp. 2873-2887.

* cited by examiner

TIME-OF-LIGHT SENSING DEVICE AND METHOD THEREOF

BACKGROUND

Time-of-flight (ToF) sensor are used in a wide range of applications to measure a distance from the ToF sensor to an object. Time-correlated single photon counting (TCSPC) methodology may be used to assist the ToF sensor to achieve a high precision rate. However, the TCSPC methodology is power hungry and it requires large data throughput.

As demand for miniaturization, low power consumption and low data throughput of a sensing device has grown recently, there has grown a need for more advanced sensing device and a sensing method that have low power consumption and low data throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
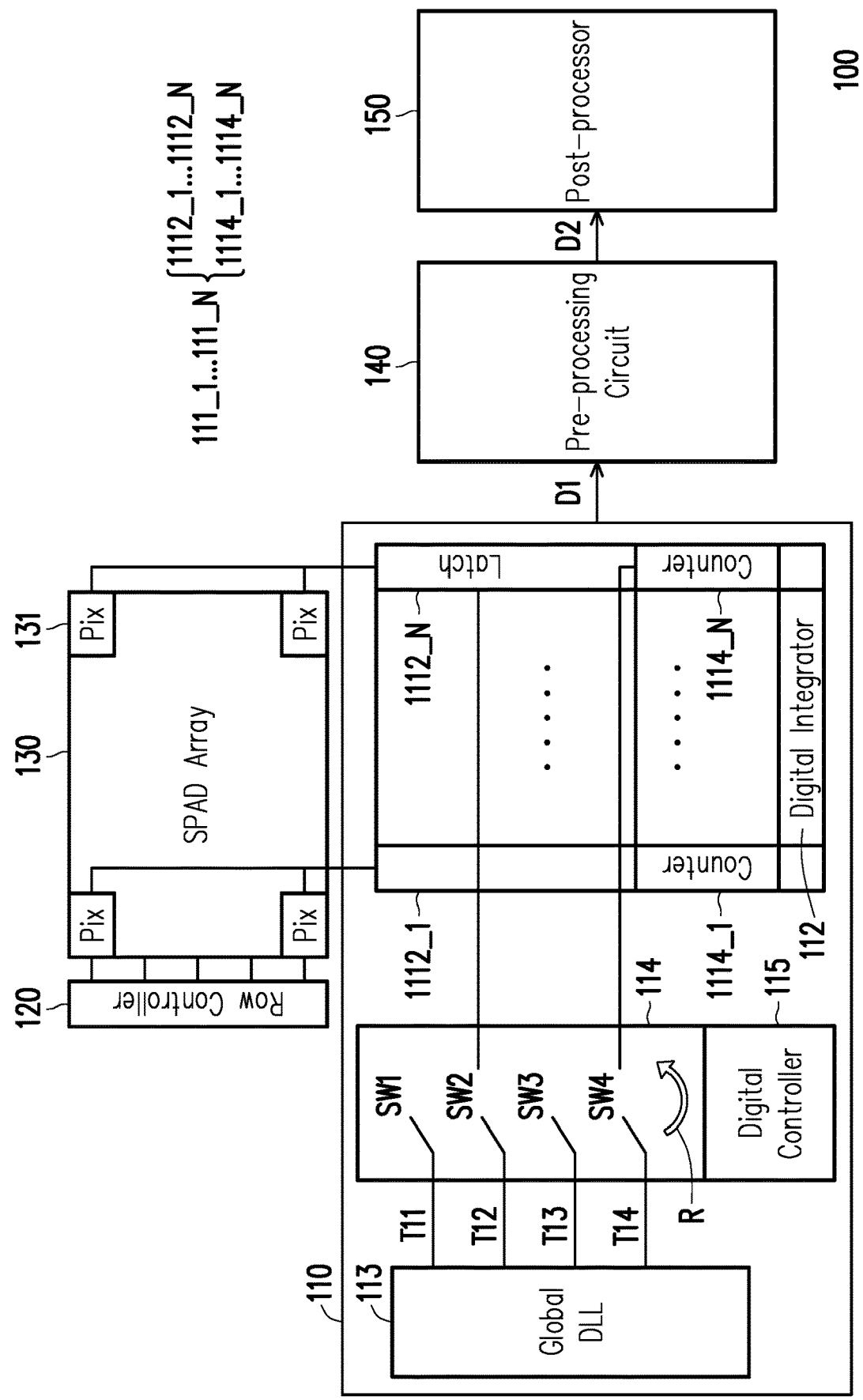
FIG. 1 is a two-dimensional schematic diagram illustrating a sensing device in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a two-dimensional schematic diagram of a sensing device 100 in accordance with some embodiments. The sensing device 100 may include an array of single photon avalanche diodes (SPADs) 130 being coupled to a readout circuit 110. The SPAD array 130 is configured to detect reflected light from an object (not shown) being illuminated by light pulses, thereby measuring a time-of-flight (ToF) value from the object to the sensing device 100. The SPAD array 130 may include a plurality of SPAD pixels 131 arranged in columns and rows of the SPAD array 130, and each of the SPAD pixels 131 could be considered as a sensing pixel (or a sensing cell) of the SPAD array 130. In some embodiments, the sensing device 100 further includes a light source (not shown) configured to emit light pulses to an object (not shown). The light source could be a laser light source that emits laser pulses to the object, but the disclosure is not limited to any specific type of light source.

In some embodiments, ToF value is calculated according to a reference time when the light pulses are emitted by the light source and an arrival time when the reflected light is received by the SPAD array 130. The SPAD array 130 may capture at least one single photon that arrives the SPAD array 130 from the reference time when the light pulse is emitted. The ToF value is used to determine a distance from the sensing device 100 to the object, and a depth results or a depth map of the object may be determined according to the distances from the sensing device 100 to dots of the object.

In some embodiments, the readout circuit 110 may include a plurality of TDCs 111_1 through 111_N, a digital integrator 112, a delay locked loop (DLL) 113, a multiplexer 114 and a digital controller 115. The TDCs 111_1 through 111_N are configured to convert an event of a detection of at least one single photon by SPAD array 130 to time-stamped digital outputs. Each of the TDCs 111_1 through 111_N may include a latch and a counter. For example, the TDC 111_1 includes a latch 1112_1 and a counter 1114_1 and the TDC 111_N includes a latch 1112_N and a counter 1114_N. When the event of the detection of at least one single photon occurs, a latching operation is performed for each pulse by the latches 1112_1 through 1112_N, and a count value is incremented by the counters 1114_1 through 1114_N as a result of the latching operation. The count value may indicate the ToF value of light pulses that have been reflected at a given dot of the object. In some embodiments, the latches 1112_1 through 1112_N are used for a fine-bit conversion, and the counters 11141 through 1114_N are used for a coarse-bit conversion.

The digital integrator 112 is configured to integrate or sum up the count values in each of the TDCs 111_1 through 11_N in each cycle to generate a raw data frame D1 for each cycle. As such, in n cycles, n raw data frames D1 are outputted by the readout circuit 110.

The DLL 113 is configured to generate a plurality of delay clock signals from a reference clock signal, and output the generated delay clock signals to output terminals T11 through T14 of the DLL 113. A number of the output terminals of the DLL 113 is determined according to designed needs, and is not limited to what is shown in FIG. 1. The generated delay clock signals may be provided to the TDCs 111_1 through 111_N via the multiplexer 114. The multiplexer 114 is configured to select a sub-group of M latches among N latches of the TDCs 111_1 through 11_N, and to select a sub-group of M output terminals among the output terminals T11 through T14 of the DLL 113 to be coupled to the selected sub-group of M latches. It should be noted that M and N are natural numbers; M is smaller than N; and N could be a total number of latches of the TDCs 111_1 through 111_N. A selection of the sub-group of M latches among N latches of the TDCs 111_1 through 111_N and a selection of the sub-group of M output terminals among the output terminals of the DLL 113 may be performed by controlling switches SW1 through SW4 of the multiplexer 114 according to control signals (not shown). In some embodiments, the control signals are generated by the digital controller 115. The digital controller 115 may include logic circuits that have a function of generating the control signals to control the operation of the multiplexer 114.

In some embodiments, the multiplexer 114 is further configured to rotate in turn a connection order between the sub-group of M latches and the sub-group of M output terminals of DLL 113 in each cycle. In other words, the connection between the latches of the TDCs 111_1 through 111_N and the output terminals of DLL 113 may be shifted in each cycle. The rotation is illustrated as an arrow R in FIG. 1. For example, in a first cycle, two among output terminals T11 through T14 of the DLL 113 are selected to couple to two certain latches among N latches of the TCDs 111_1 through 111_N. In next cycle, other two of the output terminals T11 through T14 of the DLL 113 are selected to couple to the two certain latches among N latches of the TDCs 111_1 through 111_N.

In some embodiments, the sensing device 100 may further include a row controller 120, a pre-processing circuit 140 and a post-processor 150. The row controller 120 is coupled to the SPAD array 130 and is configured to control operations of the SPAD array 130. The pre-processing circuit 140 receives the raw data frames D1 from the readout circuit 110, and is configured to perform a pre-processing operation to the raw data frames D1 to generate pre-processed data frames D2. In some embodiments, the pre-processing circuit 140 may receive n raw data frames D1 from the readout circuit 110 and generate k pre-processed data frames D2, wherein k is smaller than n.

The post-processor 150 receives the k pre-processed data frames D2 from the pre-processing circuit 140, and is configured to generate a histogram based on the k pre-processed data frames D2. The post-processor 150 is further configured to analyze the histogram to generate a depth result or a depth map of the object.

Figure 2:
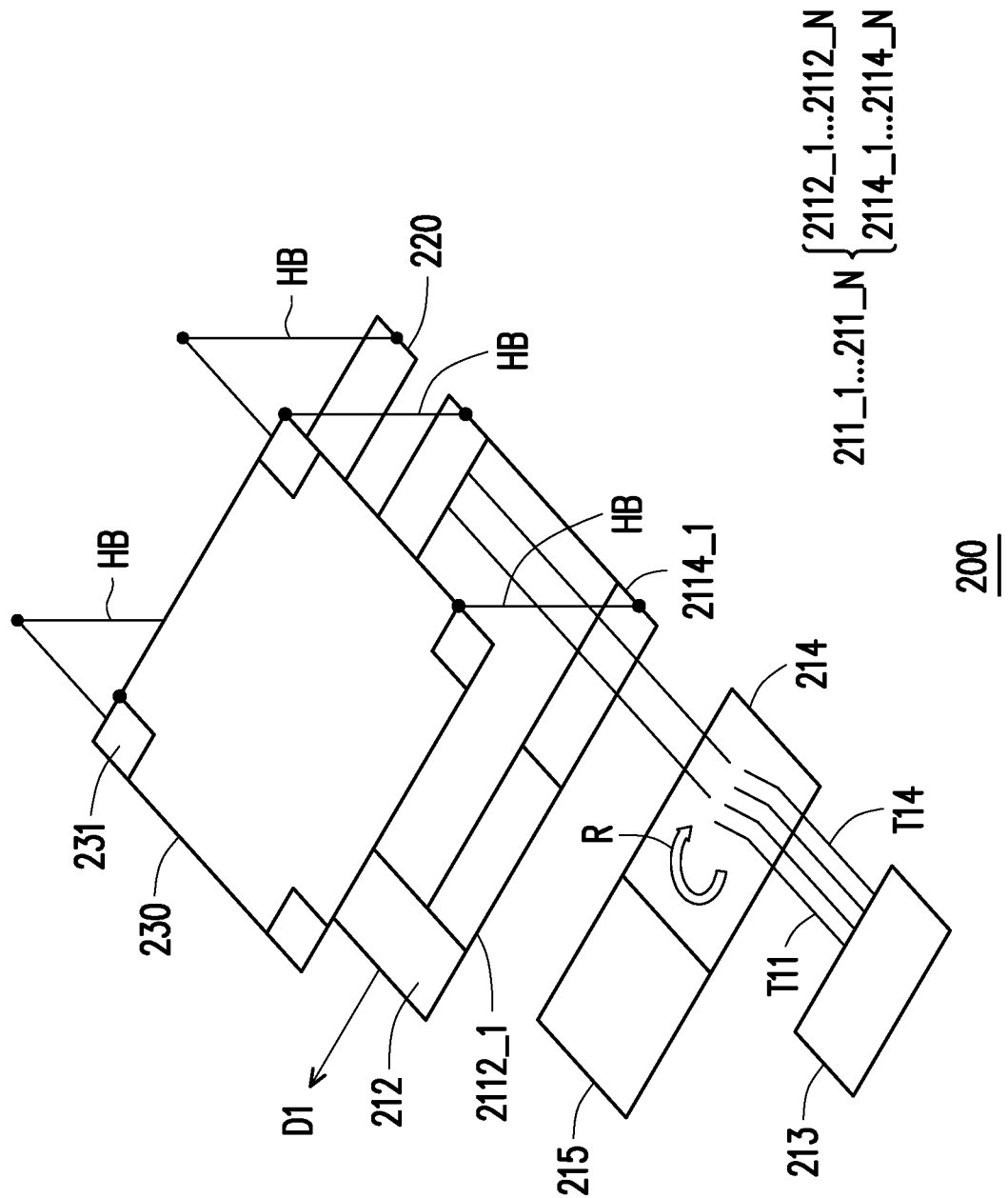
FIG. 2 is a three-dimensional schematic diagram illustrating a sensing device with column-wise time-to-digital converters (TDCs) in accordance with some embodiments.

FIG. 2 illustrates a three-dimensional schematic diagram of a sensing device 200 with column-wise TDCs in accordance with some embodiments. The sensing device 200 may include a SPAD pixel array 230, a row controller 220, a plurality of TDCs 211_1 through 211_N, an integrator 212, a DLL 213, a multiplexer 214 and a digital controller 215. The TDCs 211_1 through 211_N include latches 2112_1 through 2112N and counters 2114_1 through 2114_N. The SPAD pixel array 230, the row controller 220, the plurality of TDCs 211_1 through 211_N, the integrator 212, the DLL 213, the multiplexer 214 and the digital controller 215 are similar to the SPAD pixel array 130, the row controller 120, the plurality of TDCs 111_1 through 111_N, the integrator 112, the DLL 113, the multiplexer 114 and the digital controller 115 in FIG. 1, thus the detailed description about these components are omitted hereafter.

In FIG. 2, the SPAD array 230 is formed in a layer that is different from the layer that includes the row controller 220, the plurality of TDCs 211_1 through 211_N, the integrator 212, the DLL 213, the multiplexer 214 and the digital controller 215. As such, the SPADs 231 of the SPAD array 230 is coupled to the row controller 220 and the TDCs 211_1 through 211_N via hybrid bonds HB. In some embodiments, the TDCs 211_1 through 211_N are column-wise TDCs, where each of the TDCs 211_1 through 211_N is corresponded to a column of the SPADs of the SPAD array 230.

Figure 3:
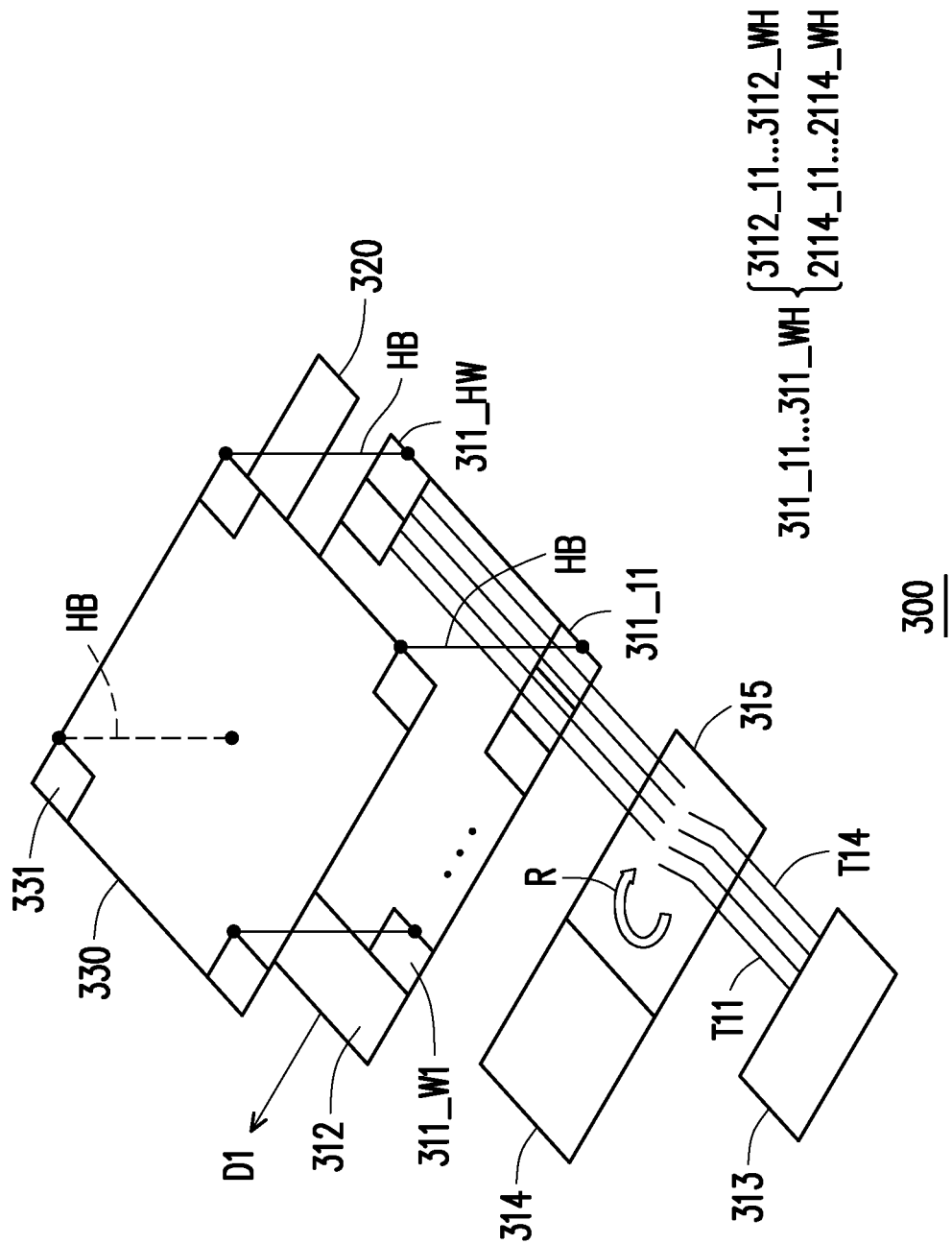
FIG. 3 is a three-dimensional schematic diagram illustrating a sensing device with pixel-wise TDCs in accordance with some embodiments.

FIG. 3 illustrates a three-dimensional schematic diagram of a sensing device 300 with pixel-wise TDCs in accordance with some embodiments. The sensing device 300 may include a SPAD pixel array 330, a row controller 320, a plurality of TDCs 311_11 through 311_WH, an integrator 312, a DLL 313, a multiplexer 314 and a digital controller 315. The TDCs 311_11 through 311_WH include latches 3112_11 through 3112_WH and counters 3114_11 through 2114_WH, in which W and H are naturals numbers. The SPAD pixel array 330, the row controller 320, the integrator 312, the DLL 313, the multiplexer 314 and the digital controller 315 are similar to the SPAD pixel array 230, the row controller 220, the integrator 212, the DLL 213, the multiplexer 214 and the digital controller 215 in FIG. 2, thus the detailed description about these components are omitted hereafter.

A difference between FIG. 2 and FIG. 3 is that the TDCs 311_11 through 311_WH are pixel-wise TDCs, where each of the TDCs 311_11 through 311_WH corresponds to one of the SPADs 331 in the SPAD array 330. Since the TDCs 311_11 through 311_WH and the SPAD array 330 are disposed in different layers, hybrid bonds HB may be used to connect the SPADs 331 of the SPAD array 330 to the TDCs 311_11 through 311_WH.

Figure 4A:
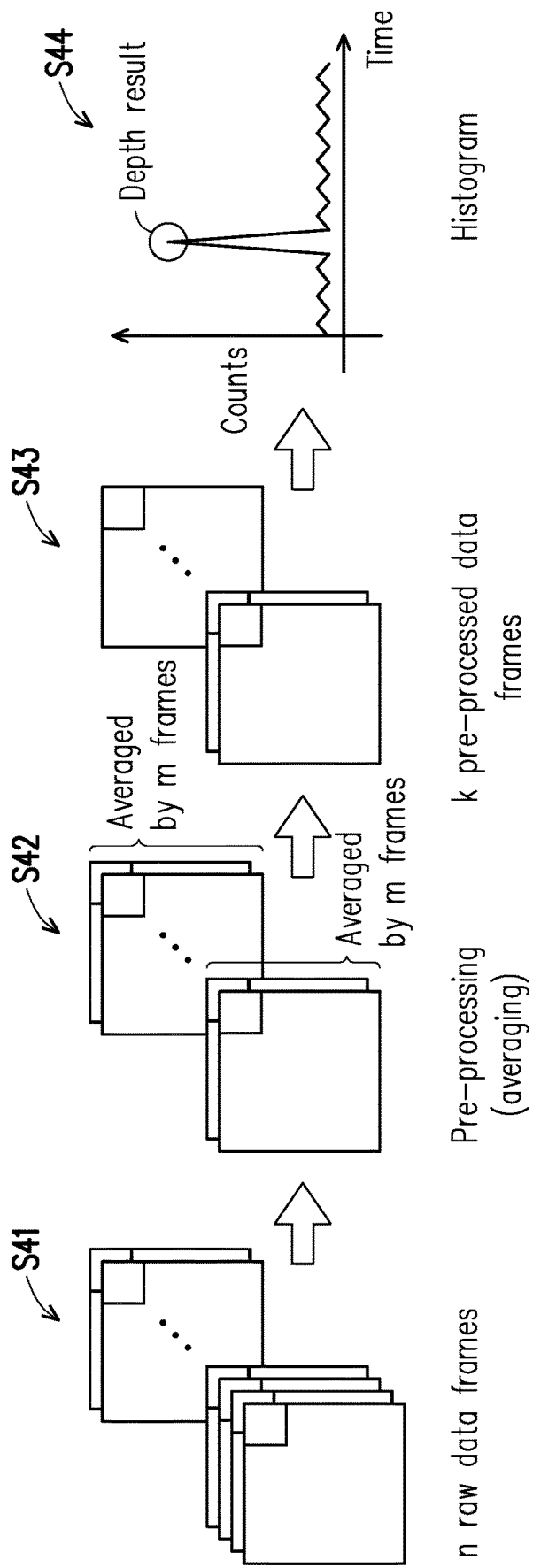
FIG. 4A a diagram illustrating data processing steps of a multiple TCSPC methodology in accordance with some embodiments.

FIG. 4A illustrates data processing steps of a multiple TCSPC methodology in accordance with some embodiments. In step S41, n raw data frames which are outputted by the readout circuit (e.g., readout circuit 110 in FIG. 1) are obtained. In some embodiments, then raw data frames have a full TDC resolution. In steps S42 and S43, a pre-processing operation is performed to the n raw data frames to obtain k pre-processed data frames, wherein k is smaller than n. The pre-processing operation may be an averaging operation which is configured to average data in each m raw data frames among the n raw data frames to generate a pre-processed data frame, where m is smaller than n. In some embodiments, n raw data frames are divided into k groups, where each of the k groups includes m raw data frames. As such, k is equal to a ratio of n and m. The data in m raw data frames in each of the k groups are averaged to generate a pre-processed data frame. In step S44, a histogram is generated according to the k pre-processed data frames, and a depth result is obtained by analyzing the histogram. Since the n raw data frames is pre-processed to output k pre-processed data frames and the k pre-processed data frames are transferred and processed the subsequent processes, the sensing device may achieve the effect of low power consumption and reduced throughput of data.

Figure 4B:
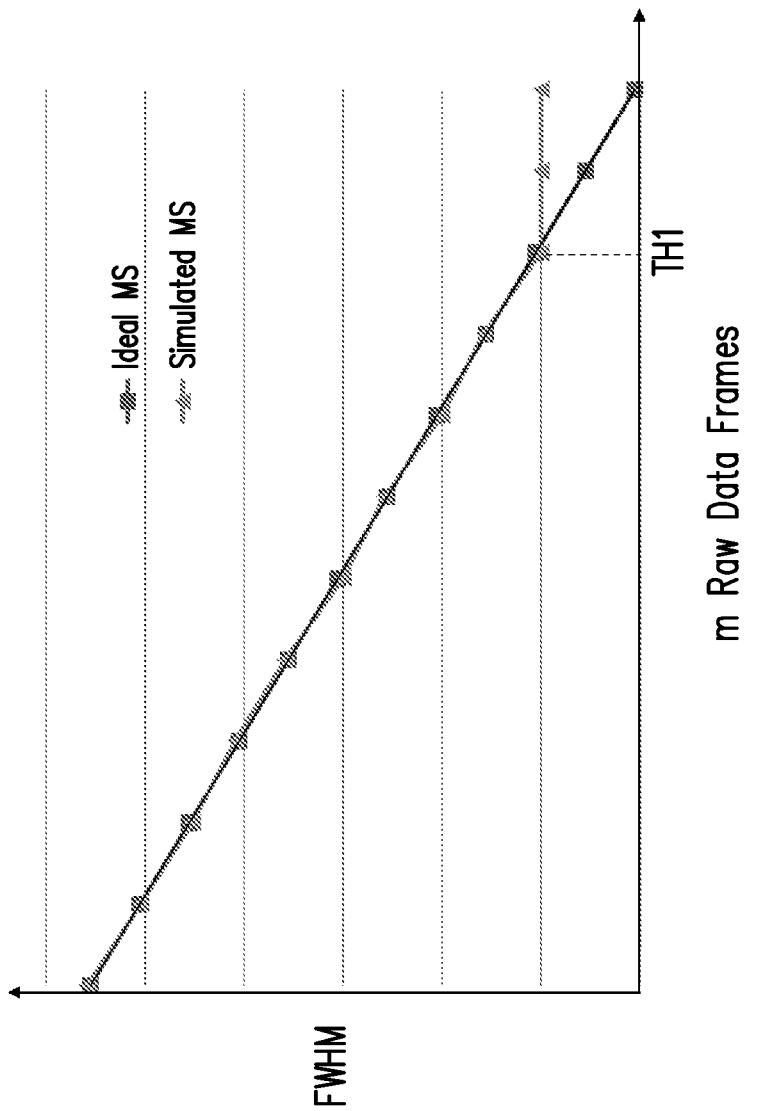
FIG. 4B is a diagram illustrating ideal and simulated full-width half maximum (FWHM) values in relation to a number of raw data frames for each pre-processing operation in accordance with some embodiments.

FIG. 4B illustrates ideal and simulated FWHM values in relation to a number of raw data frames for each pre-processing operation (m raw data frames) in accordance with some embodiments. As shown in FIG. 4B, the ideal and simulated FWHM values reduce as the value of m increases; and the simulated FWHM value is very closed to the ideal FWHM value when the value of m is smaller than a threshold value TH1. Based on the relation between the FWHM values of the histogram generated by the pre-processed data frames and the value of m (e.g., number of raw data frames for each pre-processing operation), one may determine appropriate value of m for different designed needs.

Figure 4C:
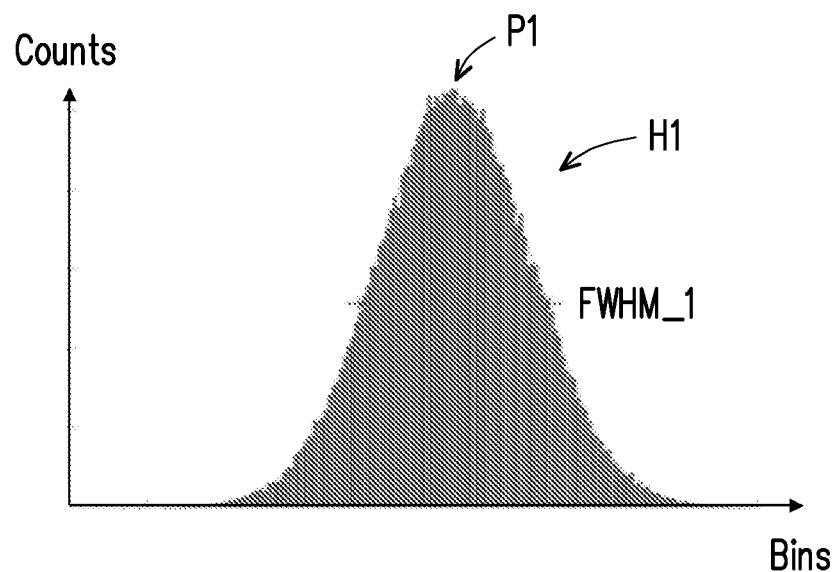
FIGS. 4C through 4E illustrate exemplary histograms obtained by raw data frames and pre-processed data frames using a multiple TCSPC methodology in accordance with some embodiments.
Figure 4D:
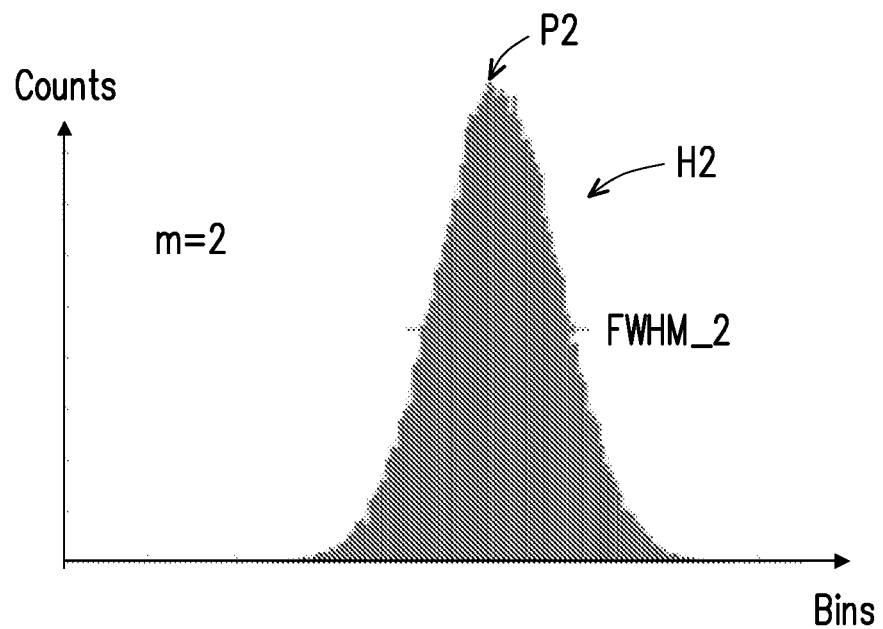
Figure 4E:
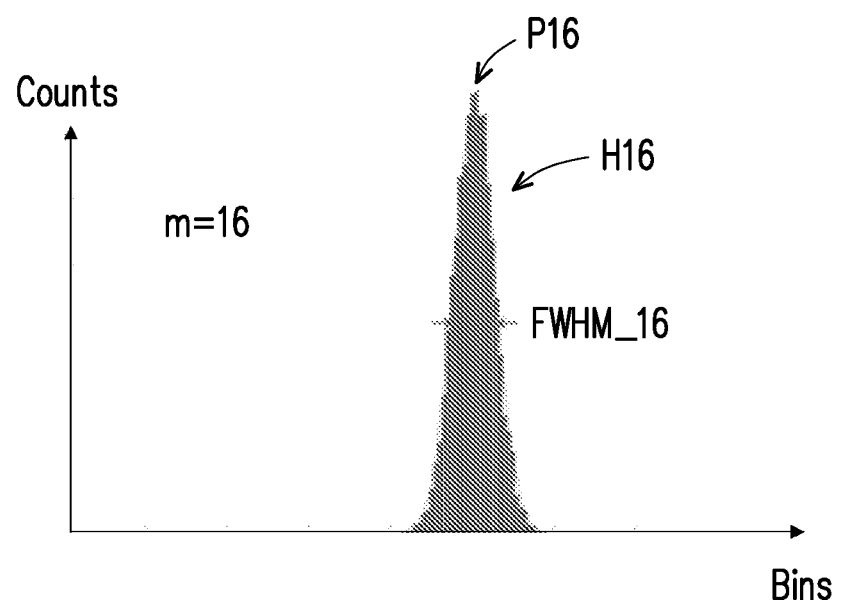

FIGS. 4C through 4D illustrate exemplary histograms and FWHM values obtained by raw data frames (FIG. 4C) and averaged data frames (FIGS. 4D and 4E) in accordance with some embodiments. Referring to FIG. 4C, a histogram H1 obtained from the raw data frames are illustrated, where the horizontal axis indicates bins of the histogram H1 and the vertical axis indicate count values for each bin of the histogram H1. In some embodiments, the bins of the histogram H1 may indicate time values. Referring to FIG. 4D, a histogram H2 obtained from the averaged data frames are illustrated, where each of the averaged data frame are obtained by averaging two raw data frames (e.g., m=2). As shown in FIGS. 4C and 4D, the FMHM value FWHM_2 in FIG. 4C is smaller than the FMHM value FWHM_1 in FIG. 4B as a result of the pre-processing operation (e.g., averaging operation). Referring to FIG. 4E, a histogram H16 obtained from the averaged data frames are illustrated, where each of the averaged data frame are obtained by averaging sixteen raw data frames (e.g., m=16).

As shown in FIGS. 4C through 4E, the FMHM value FWHM_16 in FIG. 4E is smaller than FWHM_2 in FIG. 4D and FWHM_1 in FIG. 4C. In some embodiments, a changing trends of the FWHM values follows the square root of the number of raw data frames to be averaged to generate one pre-processed data frame ($\sqrt{m}$). For example, a ratio of the FWHM_3 over FWHM_1 is corresponded to a square root of a number of raw data frames to be averaged to generate one pre-processed data frame ($\sqrt{m}$). In some embodiments, in the multiple TCSPC data, the data in each m raw data frames are averaged to one pre-processed data frame. As such, the data through put may be improved without changing the baseline structure of the TDCs in the sensing device.

Figure 5A:
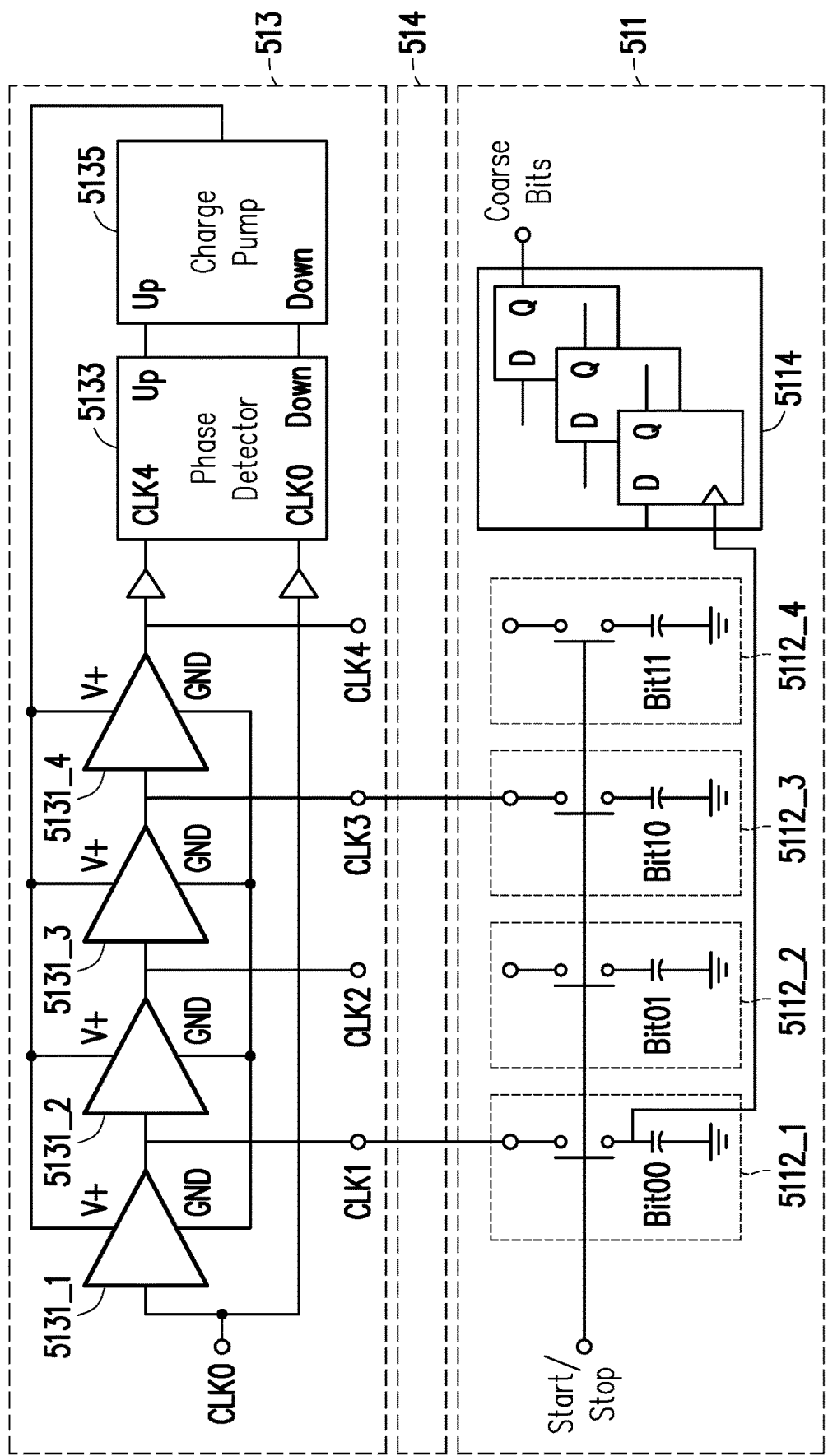
FIGS. 5A through 5B illustrate connections among a delay locked loop (DLL), a multiplexer and a TDC in different cycles of a pseudo multiple TCSPC methodology in accordance with some embodiments.

FIG. 5A illustrates connections between a DLL 513 and a TDC 511 via a multiplexer 514 in a first cycle of a pseudo multiple TCSPC methodology in accordance with some embodiments. The DLL 513 may include a plurality of delay elements 5131_1 through 5131_4, a phase detector 5133 and a charge pump 5135. The delay elements 5131_1 through 5131_4 are configured to generate a plurality of delay clock signals CLK1 to CLK4 from a reference clock signal CLK0.

It is noted that a number of delay elements in the DLL 513 and a number of delay clock signals generated by the DLL 513 are determined according to designed needs, and are not limited to what is illustrated in FIG. 5A.

The phase detector 5133 is configured to detect a phase difference of signals (e.g., CLK0 and CLK4) inputted to the phase detector 5133 and to generate UP and DN signals. The UP and DN signals are provided to the charge pump 5135 to control an output voltage outputted by the charge pump 5135. For example, the UP signal controls the charge pump 5135 to increase its output voltage and the DN signal controls the charge pump 5135 to reduce its output voltage. The delay clock signals CLK1 through CLK4 generated by the DLL 513 are provided to the multiplexer 514, and the multiplexer may select some delay clock signals among the clock signals CLK1 through CLK4 to be provided to the TDC 511 according to control signals.

The TDC 511 may include a plurality of latches 5112_1 through 5112_4 and counters 4114, wherein each of the latches 5112_1 through 5112_4 receives a start signal or a stop signal. The start signal indicates the emission of light pulses from a light source to an object, and the stop signal indicates the arrival of reflected light from the object to the SPAD array. The multiplexer 514 may select a sub-group of latches among the latches 5112_1 through 5112_4 of the TDC 511 to receive the selected delay clock signals. In FIG. 5A, the delay clock signals CLK1 and CLK3 are selected to be coupled to the selected sub-group of two latches 5112_1 and 5112_3, respectively in the first cycle. Meanwhile, the delay clock signals CLK2 and CLK4 are not supplied to the latches of the TDC 511 in the first cycle.

Figure 5B:
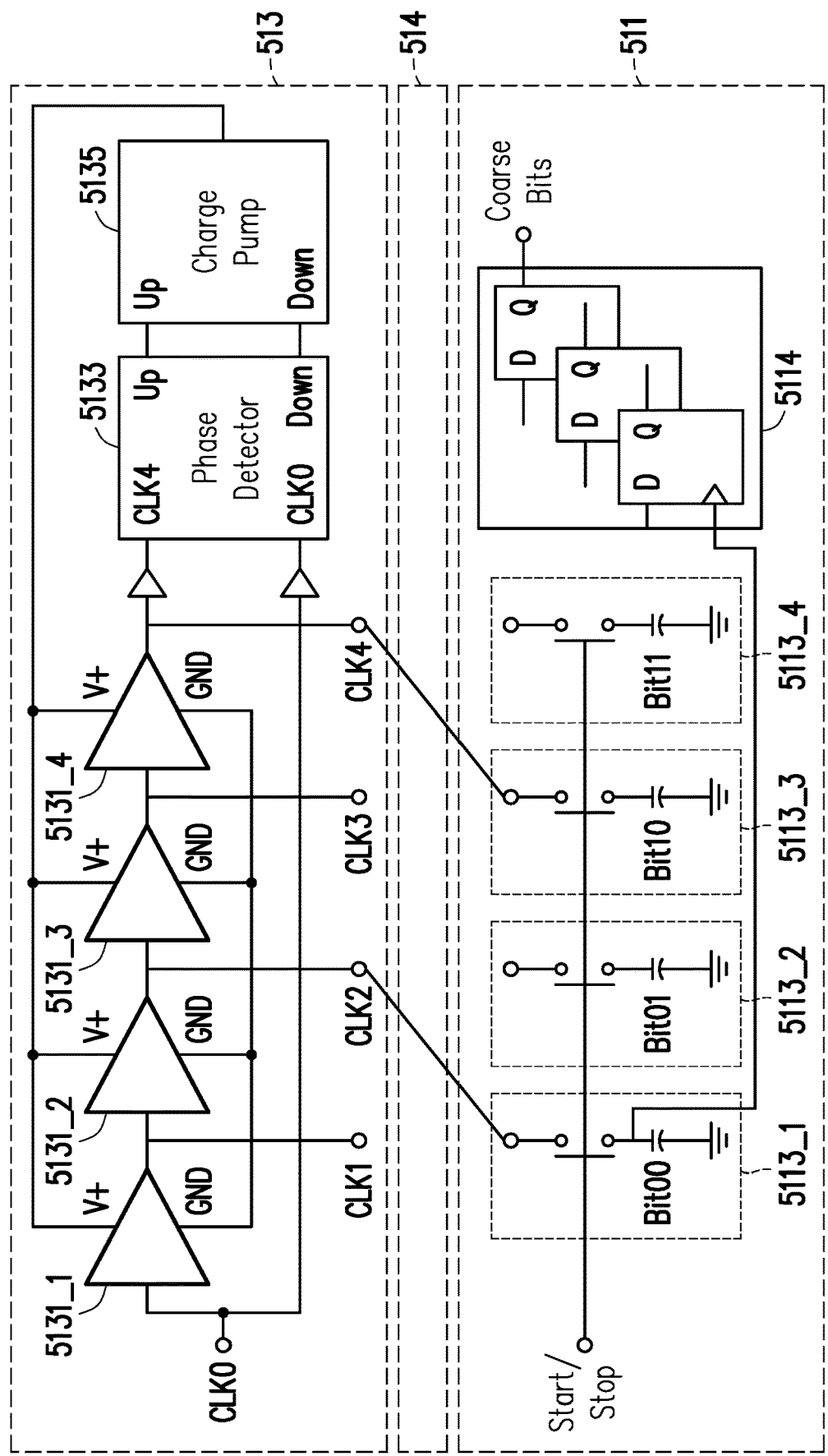

FIG. 5B illustrates a connection between the DLL 513 and the TDC 511 via the multiplexer 514 in a second cycle of a pseudo multiple TCSPC methodology in accordance with some embodiments. In the second cycle, the multiplexer 514 selects the delay clock signals CLK2 and CLK4 to be coupled to the selected sub-group of two latches 5112_1 and 5112_3. Meanwhile, the delay clock signals CLK1 and CLK3 are not supplied to latches of the TDC 511 in the second cycle. In FIGS. 5A and 5B, the latches 5112_2 and 5112_4 are not used to generate the raw data frames, and the latches 5112_2 and 5112_4 could be disabled to save power consumption.

As shown in FIGS. 5A and 5B, only parts of the latches of the TDC 511 are selected to receive delay clock signals from the DLL 513 so as to generate the raw data frames with coarse TDC resolution, and the unselected latches of the TDC 511 are disabled to save power consumption. It should be noted that the coarse TDC resolution is lower than a full TDC resolution. As the example shown in FIGS. 5A and 5B, coarse bits Bit00 and Bit10 among the full bits Bit00, Bit01, Bit10 and Bit11 are selected to generate the raw data frames, while the latches associated with bits Bit01 and Bit11 are disabled. In some embodiments, the counter may generate some bits which is combined with the coarse bits (e.g., Bit00 and Bit10) generated by the latching operations to generate the raw data frames.

Figure 5C:
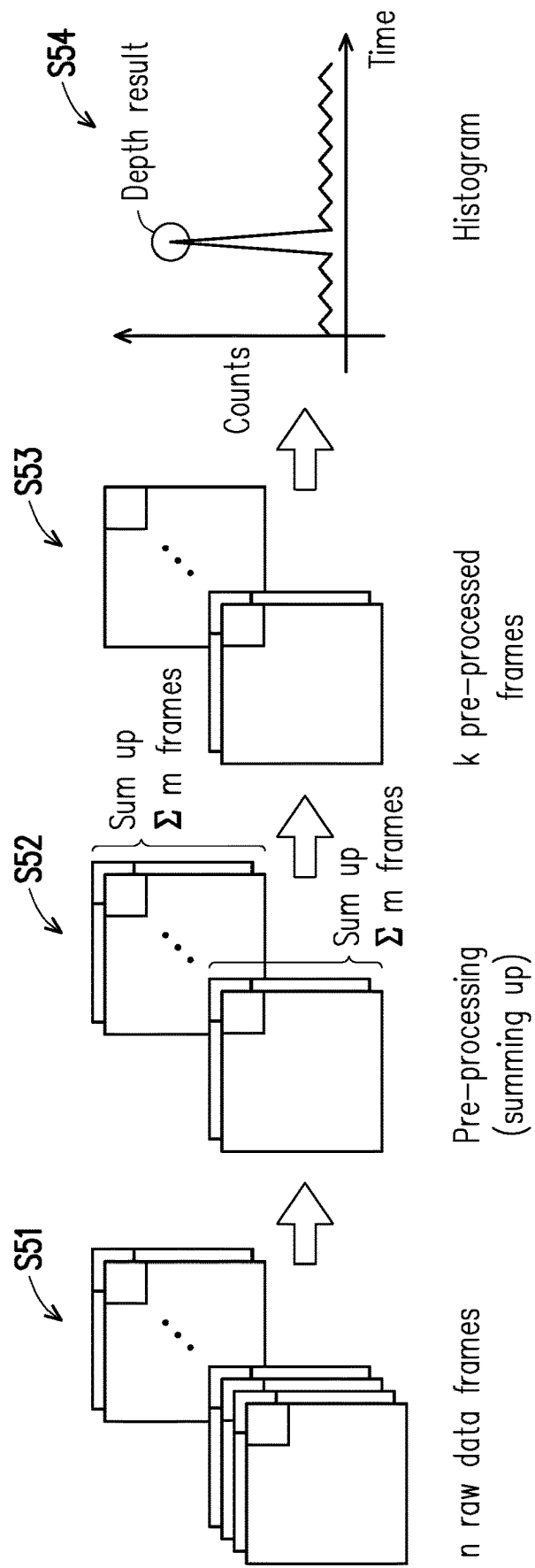
FIG. 5C is a diagram illustrating data processing steps of a pseudo multiple TCSPC methodology in accordance with some embodiments.
Figure 5D:
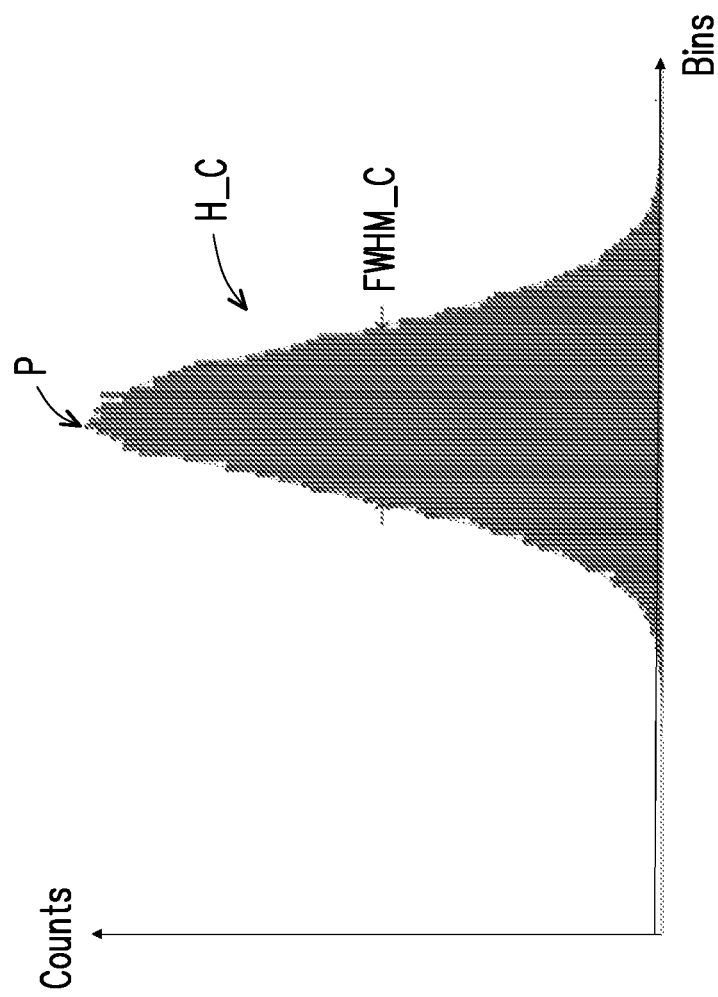
FIG. 5D illustrates an exemplary histogram obtained by a pseudo multiple TCSPC methodology in accordance with some embodiments.

FIG. 5C illustrates data processing steps of a pseudo multiple TCSPC methodology in accordance with some embodiments. In step S51, n raw data frames with coarse TDC resolution which are outputted TDCs (e.g., TDC 511 in FIGS. 5A and 5B) are obtained. In steps S52 and S53, a pre-processing operation is performed to the n raw data frames to obtain k pre-processed data frames, wherein k is smaller than n. The pre-processing operation may be a summing operation which is configured to sum up data in each m raw data frames among the n raw data frames of data to generate a pre-processed data frame. In some embodiments, n raw data frames are divided into k groups, where each of the k groups includes m frames. As such, k is equal to a ratio of n and m. The data in m raw data frames in each of the k groups are summed up to generate a pre-processed data frame. In step S54, a histogram is generated according to the k pre-processed data frames; and a depth result is obtained by analyzing the histogram. An exemplary histogram H_C obtained by using the pseudo multiple TCSPC methodology is illustrated in FIG. 5D, where the FWHM value FWHM_C and a peak value P of the histogram may be obtained may analyzing the histogram H_C. Since the n raw data frames have coarse TDC resolution and m raw data frames are pre-processed (e.g., summed up) before performing subsequent processes, the power consumption and data throughput of the sensing device is reduced.

Figure 5E:
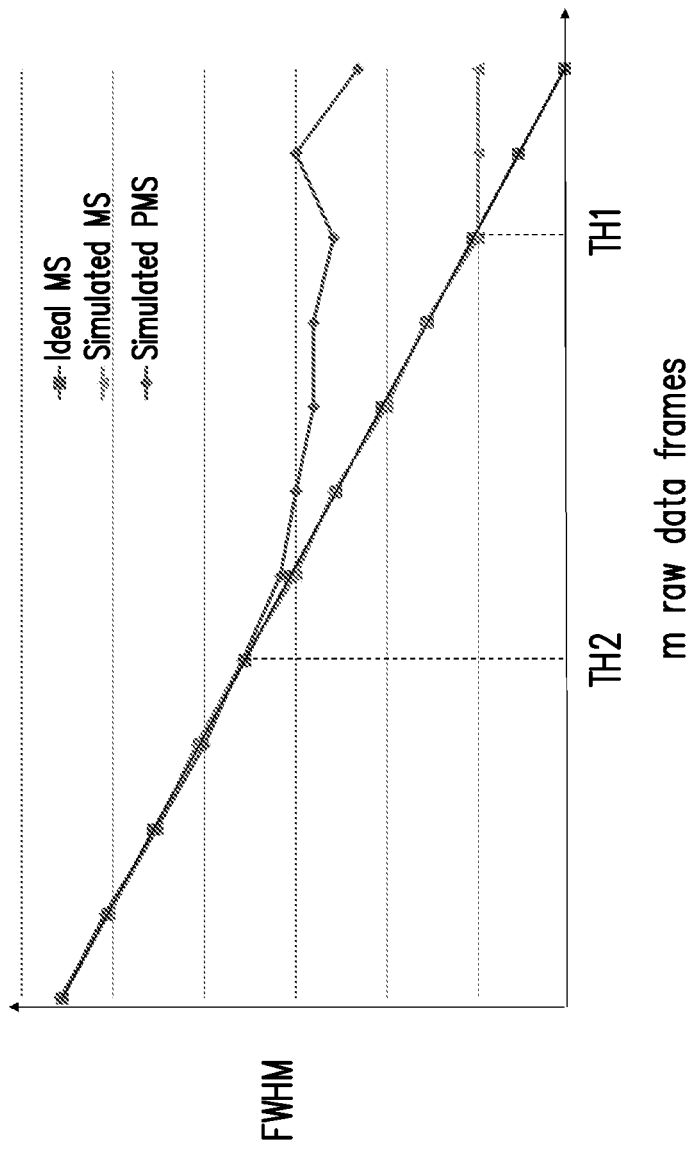
FIG. 5E illustrates FWHM values obtained by using a multiple TCSPC methodology and a pseudo multiple TCSPC methodology in relation to a number of raw data frames for each pre-processing operation in accordance with some embodiments.

FIG. 5E illustrates ideal and simulated FWHM values obtained by using the multiple TCSPC methodology (illustrated as "ideal MS" and "simulated MS" in FIG. 5E) and simulated FWHM values obtained by using pseudo multiple TCSPC methodology (illustrated as "simulated PMS" in FIG. 5E) in relation to a number of raw data frames for each pre-processing operation in accordance with some embodiments. As shown in FIG. 5E, the simulated FWHM values obtained by the multiple TCSPC methodology and the FWHM values obtained by the pseudo multiple TCSPC methodology reduce as the number of raw data frames (e.g., m raw data frames) for each pre-processing operation increase. When the number of raw data frames for each pre-processing operation reaches a threshold TH2, the FWHM values obtained by the multiple TCSPC methodology start diverging from the ideal FWHM values. When the of raw data frames for each pre-processing operation reaches a threshold TH1, the FWHM values obtained by using the pseudo multiple TCSPC methodology start diverging from the ideal FWHM values. By analyzing the relation between the number of raw data frames for each pre-processing operation and the FWHM values, it may determine a desired number of raw data frames for each pre-processing operation.

Referring to Table 3, differences among a TCSPC methodology, a multiple TCSPC methodology and a pseudo multiple TCSPC methodology are illustrated in accordance with some embodiments. In n cycles, each of the TCSPC, multiple TCSPC and pseudo multiple TCSPC methodologies emits one light pulse per cycle. In TCSPC methodology, there is no sub-grouping or pre-processing operation, while the multiple TCSPC and pseudo multiple TCSPC methodologies group each m raw data frames to one sub-group and performs a pre-processing operation to m raw data frames for each sub-group. In some embodiments, the multiple TCSPC methodology may perform an averaging operation to each m raw data frames to generate one pre-processed data frame, while the pseudo multiple TCSPC methodology may perform a summing up operation to each m raw data frames to generate one pre-processed data frames. As a result, the frames number for generating histogram in the multiple TCSPC methodology and the pseudo multiple TCSPC methodology are n/m (n divided by m); and the FWHM values of the multiple TCSPC methodology and the pseudo multiple TCSPC methodology are Width/$\sqrt{m}$. In other words, the FWHM values are reduced by $\sqrt{m}$; and the throughput is reduced by m for the multiple TCSPC methodology and the pseudo multiple TCSPC methodology.

TABLE 3

| | TCSPC | Multiple TCSPC | Pseudo Multiple TCSPC |
|---|---|---|---|
| Cycle | n | n | n |
| Light Pulse/Cycle | 1 | 1 | 1 |
| Frames per Sub-Group | 1 | m | m |
| Data pre-Processing | No | Yes (e.g., averaging m raw data frames) | Yes (e.g., summing up m raw data frames) |
| Full-Width of Half Maximum (FWHM) | Width | Width/$\sqrt{m}$ | Width/$\sqrt{m}$ |
| Data frames for histogram | n | n/m | n/m |

Figure 6:
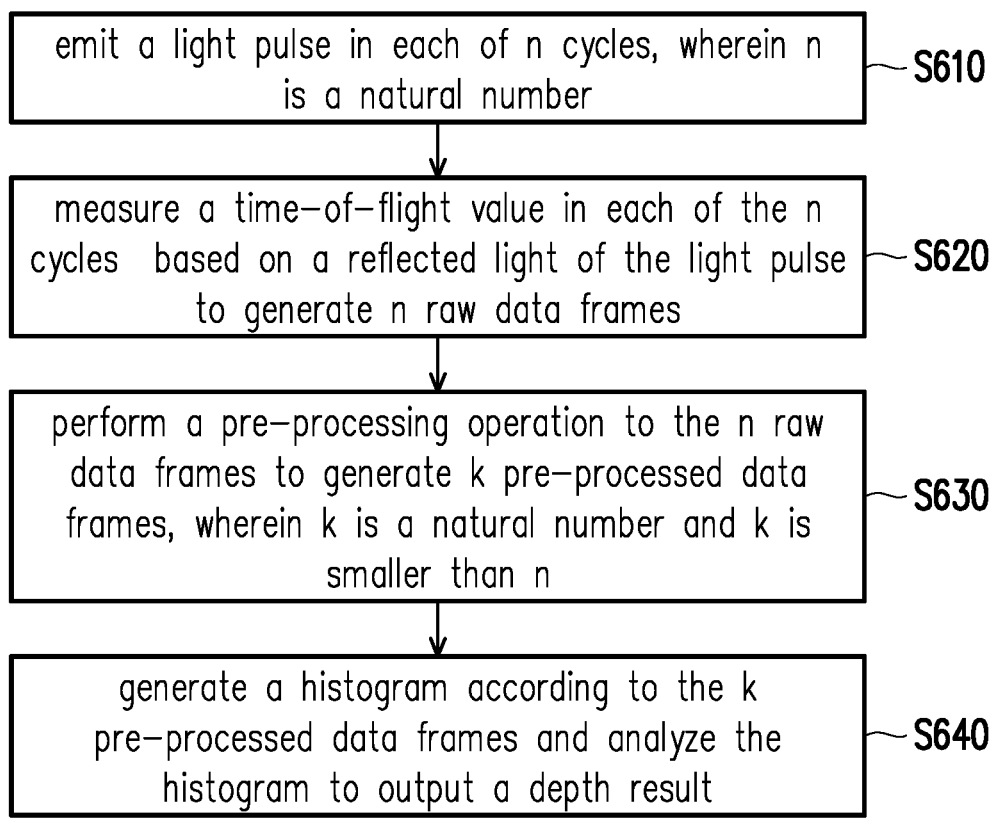
FIG. 6 is a flowchart diagram illustrating a method for outputting a depth result in accordance with some embodiments.

FIG. 6 illustrates a method for outputting a depth result in accordance with some embodiments. In step S610, alight pulse is emitted in each of n cycles. The light pulse may be a laser light pulse which is emitted from a laser source, but the disclosure is not limited to any specific type of light and light source. In step S620, a time-of-flight value in each of the n cycles is measured based on a reflected light of the light pulse to generate n raw data frames. The reflected light could be the light reflected from an object when the light pulse hit the object. In some embodiments, the n raw data frame may be generated by a readout circuit having TDCs, and the raw data frames may have a full resolution of the TDCs. In step S630, a pre-processing operation is performed to the n raw data frames to generate k pre-processed data frames, wherein k is a natural number and k is smaller than n. In some embodiments, the n raw data frames are grouped in to sub-groups, where each of the sub-groups include m raw data frames. The pre-processing operation could be an averaging operation that is performed to average data in each m raw data frames to generate one pre-processed data frame. In step S640, a histogram is generated according to the k pre-processed data frames and the histogram to is analyzed output a depth result. In some embodiments, a peak value of the histogram and a FWHM value of the histogram are obtained during the analyzing process to generate the depth result and a timing jitter value.

Figure 7:
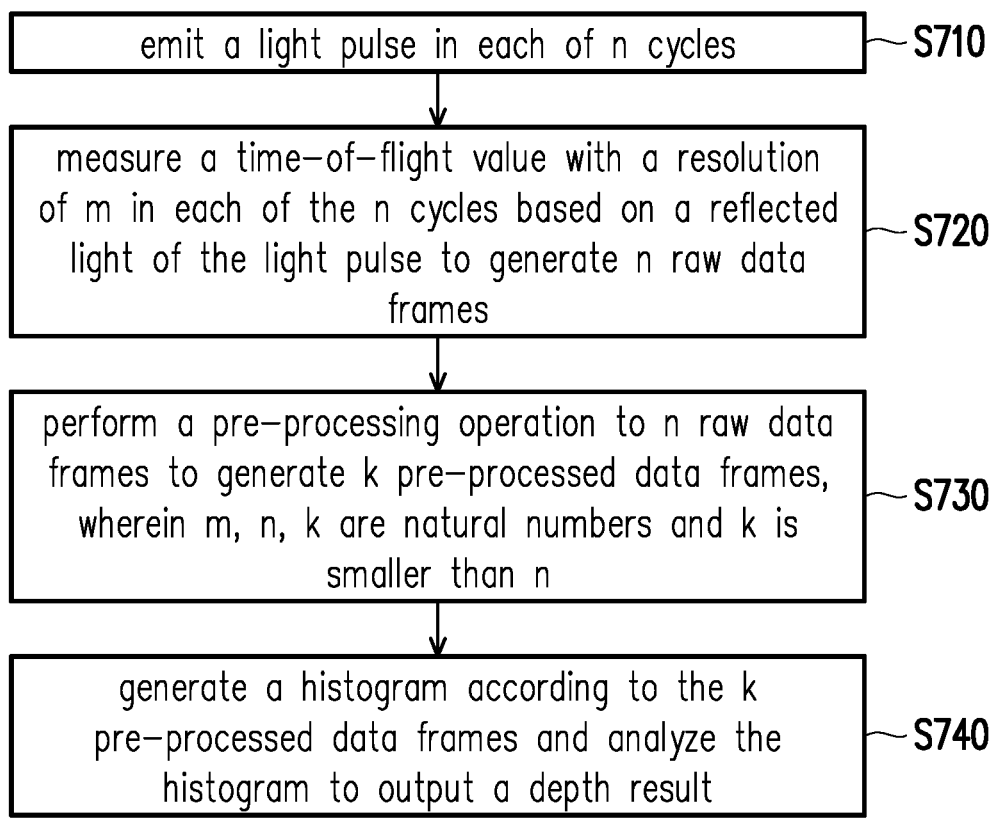
FIG. 7 is a flowchart diagram illustrating a method for outputting a depth result in accordance with some embodiments.

FIG. 7 illustrates method for outputting a depth result in accordance with some embodiments. In step S710, a light pulse is emitted in each of n cycles. In step S720, a time-of-flight value with a resolution of m is measured in each of n cycles based on a reflected light of the light pulse to generate n raw data frames. In some embodiments, the n raw data frames are generated by a readout circuit including TDCs, where the resolution of m is a coarse resolution which is smaller than the full resolution of the TDCs in the readout circuit. In step S730, a pre-processing operation is performed to n raw data frames to generate k pre-processed data frames, wherein m, n, k are natural numbers and k is smaller than n. In some embodiments, the n raw data frames are divided into sub-groups, each of the sub-group may have m number of raw data frames. The pre-processing operation could be a summing operation that is configured to sum up the data of m raw data frames in each of the sub-groups to generate one of the pre-processed data frames. In step S740, a histogram is generated according to the k pre-processed data frames and the histogram is analyzed to output a depth result. In some embodiments, a peak value of the histogram and a FWHM value of the histogram are obtained during the analyzing process to generate the depth result and a timing jitter value.

According to some embodiments, a sensing device including a delay locked loop circuit, a plurality of time-to-digital converters, a multiplexer and a digital integrator is introduced. The delay locked loop circuit is configured to output a plurality of delay clock signals through output terminals of the delay locked loop circuit. The plurality of time-to-digital converters include a plurality of latches. The multiplexer is configured to select a sub-group of m latches among the latches of the plurality of time-to-digital converters to be connected to the output terminals of the delay locked loop circuit according to a control signal. The digital integrator is coupled to the plurality of time-to-digital converters and is configured to integrate digital outputs generated by the time-to-digital converters in each of n cycles to generate n raw data frames, wherein m and n are natural numbers, and the n raw data frames are used to generate a depth result.

According to some embodiments, a method includes steps of emitting a light pulse in each of n cycles; measuring a time-of-flight value in each of the n cycles to generate n raw data frames; performing a pre-processing operation to the n raw data frames to generate k pre-processed data frames, wherein n and k are natural numbers, and k is smaller than n; and generating a histogram according to the k pre-processed data frames and analyzing the histogram to output a depth result.

According to some embodiments, a method includes steps of emitting a light pulse in each of n cycles; measuring a time-of-flight value with a resolution of min each of the n cycles to generate n raw data frames; performing a pre-processing operation to n raw data frames to generate k pre-processed data frames, wherein m, n and k are natural numbers, and k is smaller than n; and generating a histogram according to the k pre-processed data frames and analyzing the histogram to output a depth result.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A sensing device, comprising:
a delay locked loop circuit, configured to output a plurality of delay clock signals through output terminals of the delay locked loop circuit;
a plurality of time-to-digital converters, comprising a plurality of latches;
a multiplexer, configured to select a sub-group of m latches among the latches of the plurality of time-to-digital converters to be connected to the output terminals of the delay locked loop circuit according to a control signal; and
a digital integrator, coupled to the plurality of time-to-digital converters, and configured to integrate digital outputs generated by the time-to-digital converters in each of n cycles to generate n raw data frames, wherein m and n are natural numbers, and the n raw data frames are used to generate a depth result.

2. The sensing device of claim 1, further comprising:
a digital controller, coupled to the multiplexer, and configured to generate the control signal, wherein the control signal is configured to rotate in turn a connection order between the sub-group of m latches and the output terminals of the delay locked loop circuit in each of the n cycles.

3. The sensing device of claim 2, further comprising:
a pre-processing circuit, configured to receive the n raw data frames, and perform a pre-processing operation to the n raw data frames to generate k pre-processed data frames, wherein k is a natural number, and k is smaller than n; and
a processor, configured to receive the k pre-processed data frames, generate a histogram according to the k pre-processed data frames, and analyze the histogram to output the depth result.

4. The sensing device of claim 3, wherein k is equal to a ratio of n and m.

5. The sensing operation of claim 3, wherein the pre-processing operation is an averaging operation that is configured to average data of each m raw data frames among the n raw data frames to generate one of the k pre-processed data frames.

6. The sensing operation of claim 3, wherein the pre-processing operation is a summing operation that is configured to sum up data of each m raw data frames among the n raw data frames to generate one of the k pre-processed data frames.

7. The sensing device of claim 3, wherein the processor is configured to analyze a full-width of half maximum value and a peak value of the histogram to generate the depth result.

8. The sensing device of claim 1, wherein the multiplexer is further configured to select m delay clock signals among the delay clock signals outputted by the delay looked loop circuit, and connect the selected m delay clock signals to the selected sub-group of m latches according to the control signal.

9. The sensing device of claim 1, further comprising:
a pixel array, comprising a plurality of single-photon avalanche diode (SPAD) pixels,
wherein the time-to-digital converters are column-wise time-to-digital converters, an each of the column-wise time-to-digital converters corresponds to a column of SPAD pixels in the pixel array.

10. The sensing device of claim 1, further comprising:
a pixel array, comprising a plurality of single-photon avalanche diode (SPAD) pixels,
wherein the time-to-digital converters are pixel-wise time-to-digital converters, and each of the pixel-wise time-to-digital converters corresponds to one of the SPAD pixels in the pixel array.

* * * * *